(12) United States Patent
Zhang (10) Patent No.: US 10,146,245 B2
(45) Date of Patent: Dec. 4, 2018

(54) I-V CONVERTING MODULE (71) Applicant: SHENZHEN GOODIX TECHNOLOGY CO., LTD., Shenzhen, Guangdong (CN)

(72) Inventor: Mengwen Zhang, Guangdong (CN)

(73) Assignee: SHENZHEN GOODIX TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/793,563

(22) Filed: Oct. 25, 2017

(65) Prior Publication Data
US 2018/0052480 A1 Feb. 22, 2018

Related U.S. Application Data (63) Continuation of application No. PCT/CN2016/095429, filed on Aug. 16, 2016.

(51) Int. Cl.
G11C 27/02 (2006.01)
G05F 3/26 (2006.01)
H02M 11/00 (2006.01)

(52) U.S. Cl.
CPC .............. *G05F 3/262* (2013.01); *G11C 27/02* (2013.01); *H02M 11/00* (2013.01)

(58) Field of Classification Search
CPC ........ G05F 3/262; H02M 11/00; G11C 27/02; G11C 27/024; G11C 27/026
See application file for complete search history.

(56) References Cited

U.S. PATENT DOCUMENTS

| | | | | |
|---|---|---|---|---|
| 4,210,872 A | * | 7/1980 | Gregorian | H03H 15/00 330/107 |
| 5,909,643 A | * | 6/1999 | Aihara | H03G 1/0088 330/51 |
| 7,012,411 B2 | * | 3/2006 | Yasukouchi | H02M 3/156 323/282 |
| 2009/0251203 A1 | | 10/2009 | Kimura | |

FOREIGN PATENT DOCUMENTS

| | | |
|---|---|---|
| CN | 202331254 U | 7/2012 |
| CN | 104536510 A | 4/2015 |
| CN | 104614568 A | 5/2015 |
| CN | 204595666 U | 8/2015 |

* cited by examiner

*Primary Examiner* — Jung Kim
(74) *Attorney, Agent, or Firm* — Heslin Rothenberg Farley & Mesiti P.C.

(57) ABSTRACT

An I-V converting module includes: a current output sensor, an I-V transforming circuit, a sampling and holding circuit, a source follower, a loop switch, and a bypass circuit. A drain of the source follower is connected to an input/output end of the sampling and holding circuit. A source of the source follower is connected to an input end of the I-V transforming circuit and an output end of the current output sensor, and a gate of the source follower is connected to an output end of the I-V transforming circuit via the loop switch, and to the bypass circuit. When the loop switch is closed and the bypass circuit is disabled, a feedback loop formed by the source follower, the I-V transforming circuit and the loop switch is conducted, and the I-V converting module enters into a sampling setup stage.

9 Claims, 5 Drawing Sheets

I-V CONVERTING MODULE

CROSS-REFERENCE TO RELATED APPLICATION

The present application is a continuation of international application No. PCT/CN2016/095429 filed on Aug. 16, 2016, which is hereby incorporated by reference herein, in its entirety.

TECHNICAL FIELD

The present disclosure relates to the field of electronic circuit technologies, and in particular, to an I-V converting module.

BACKGROUND

Figure 1:
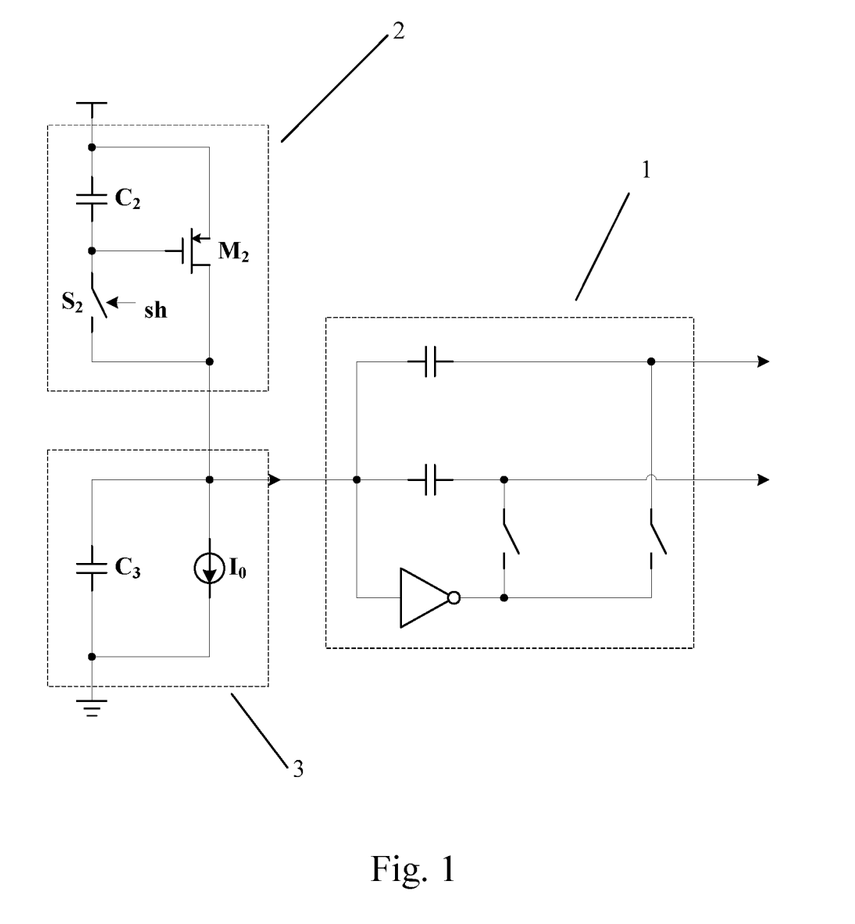
FIG. 1 is a circuit structural diagram of an existing I-V converting module in the background.

An existing current to voltage converting module, i.e. an I-V converting module, as shown in FIG. 1, consists of a regular I-V transforming circuit 1, a sampling and holding circuit 2, and a current output sensor 3. The sampling and holding circuit 2 counteracts a direct current component output by the current output sensor 3 to enlarge an output dynamic range of the I-V converting module. However, a setup speed of the existing sampling and holding circuit 2 is relatively slow. This decreases a speed of the entire I-V conversion, in other words, this results in a longer time for obtaining an alternating current signal.

In the existing I-V converting module, if a current output by the current output sensor 3 is $I_0$, and the direct current component output by the current output sensor 3 is I, in a sampling setup stage, that is, when a control signal sh is at a high level, a switch $S_2$ is closed. In this situation, a P-type field-effect transistor $M_2$ is equivalent to a resistor having a resistance of gm. Because a field-effect transistor $M_2$ usually works in a sub-threshold region, the resistance of the field-effect transistor $M_2$ is in positive proportion to the direct current component I output by the current output sensor 3, that is, gm=α·I (α is a constant). When the control signal sh is at a low level, that is, a moment when the switch $S_2$ is open, a voltage of a plate of a parasitic capacitor $C_3$ connected to a sampling capacitor $C_2$ begins to be established, and a time constant of the sampling and holding circuit 2 is therefore $\tau=(C_3+C_2)/gm=(C_3+C_2)/\alpha \cdot I$.

Taking a parameter that frequently appears in the above formula as an example, if gm=α·I=1 μS, $C_3$=100 pF, and $C_2$=1 pF, the time constant is τ=100 μs. During the conception of the present invention, the inventor discovered that the existing technology has the following problems: the setup speed of the sampling and holding circuit 2 is very low, and consequently the I-V transforming circuit 1 needs a long time to collect an alternating current component output by the current output sensor 3 and the converting rate of the I-V converting module may be severely decreased.

SUMMARY

Some embodiments of the present disclosure aim to provide an I-V converting module, to greatly accelerate a setup speed of a sampling and holding circuit, thereby increasing the converting rate of the I-V transforming circuit.

To solve the above technical problem, some embodiments of the present disclosure provide an I-V converting module including: a current output sensor, an I-V transforming circuit, a sampling and holding circuit, a source follower, a loop switch and a bypass circuit. A drain of the source follower connects to an input/output end of the sampling and holding circuit, a source of the source follower connects to an input end of the I-V transforming circuit and an output end of the current output sensor, and a gate of the source follower connects to an output end of the I-V transforming circuit via the loop switch; and the gate of the source follower further connects to the bypass circuit. When the loop switch is closed and the bypass circuit is disabled, a feedback loop that is formed by the source follower, the I-V transforming circuit and the loop switch is conducted, and the I-V converting module enters into a sampling setup stage. When the loop switch is disconnected and the bypass circuit is enabled, the feedback loop is bypassed, and the I-V converting module enters into an I-V converting stage.

Compared with existing technologies, some embodiments of the present disclosure provide an I-V converting module. In a sampling setup stage, a feedback loop formed by the source follower, the I-V transforming circuit and the loop switch, is conducted, and the source follower separates the sampling and holding circuit from the current output sensor, so that a time constant formed by the sampling and holding circuit and the current output sensor greatly decreases, the setup speed of the sampling and holding circuit is greatly accelerated, and the converting rate of the I-V converting module is increased. Moreover, in the present disclosure, a voltage of an output end of the current output sensor in the sampling setup stage maintains to be unchanged, which ensures that an output current does not to change with a voltage of the output end, and which ensures the consistency of the magnitude of an output current of the current output sensor.

In addition, the I-V converting module further includes a loop capacitor. The loop capacitor is connected between the gate of the source follower and the input end of the I-V transforming circuit to improve the stability of the feedback loop.

In addition, the bypass circuit includes a bypass switch and a power supply, and the bypass switch is connected between the gate of the source follower and the power supply, wherein the bypass circuit is disabled when the bypass switch is disconnected. This embodiment provides a specific example of a bypass circuit, and this bypass circuit is relatively simple.

In addition, the bypass circuit includes a first bypass switch, a second bypass switch, and a ground plane. The first bypass switch connects between the gate of the source follower and the ground plane. The second bypass switch connects between the source and the drain of the source follower. Wherein the bypass circuit is disabled when both of the first bypass switch and the second bypass switch are disconnected. This embodiment provides another specific implementation manner of another bypass circuit. Compared with the above bypass circuit, a ripple in the power supply is avoided to be introduced to the I-V transforming circuit, thereby increasing the signal-to-noise ratio of an I-V transforming circuit 1, that is, improving the power supply rejection capability of the I-V transforming circuit.

In addition, an inverting amplifier includes an inverter or an operational amplifier. Two different types of inverting amplifiers are provided to expand an application scenario of the present disclosure.

In addition, a transforming path includes a resistor and a switch that are connected in series, or a capacitor and a switch that are connected in series. Two different types of transforming paths are provided to ensure the feasibility of the present disclosure.

In addition, the source follower includes an N-type field-effect transistor or an NPN-type triode. Different types of source followers are provided to expand an application scenario of the present disclosure.

In addition, the loop switch is an electronic switch or a physical switch. Different types of loop switches are provided to expand an application scenario of the present disclosure.

DETAILED DESCRIPTION

In order to make the objectives, technical solutions and advantages of the present disclosure clearer, some of embodiments of the present disclosure will be further described in details with reference to the drawings. However it should be understood by the person skilled in the art that in some embodiments of this patent application, various technical details are described to make this application easier to be understood. However, the technical solutions sought to be protected by the claims of this patent application may be implemented even without the technical details and the various changes and modification made to the embodiments below.

Figure 2:
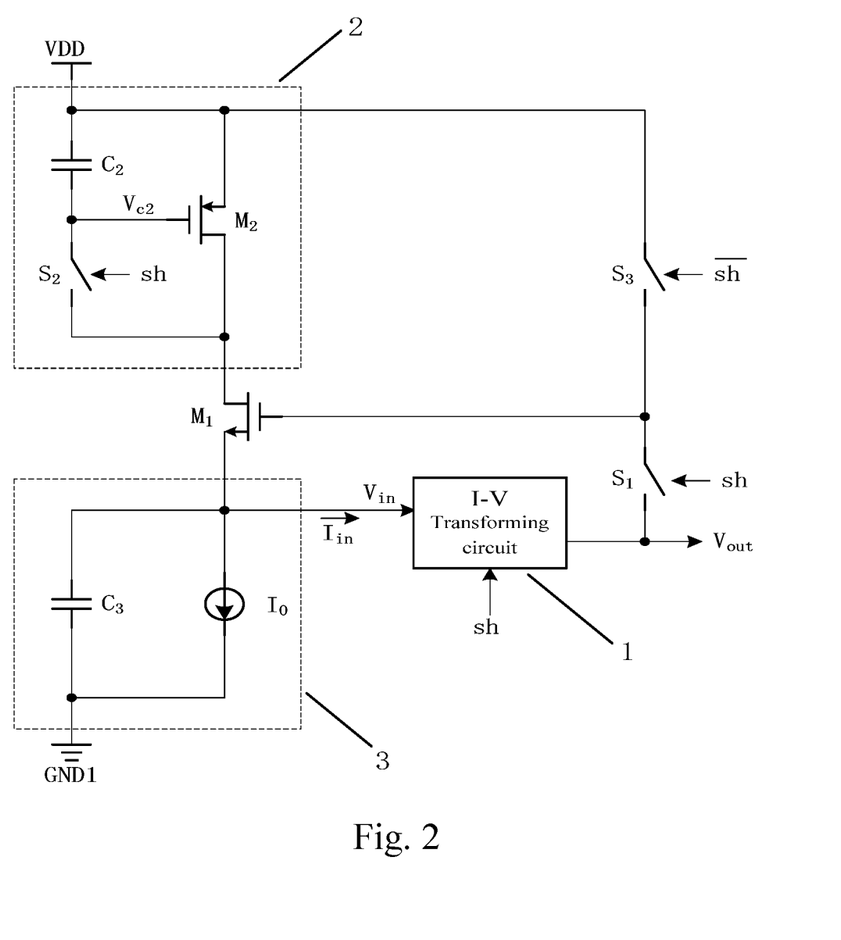
FIG. 2 is a circuit structural diagram of an I-V converting module according to a first embodiment of the present disclosure.

A first embodiment of the present disclosure relates to an I-V converting module, i.e., a current to voltage converting module. As shown in FIG. 2, the I-V converting module includes: an I-V transforming circuit 1, a sampling and holding circuit 2, a current output sensor 3, a source follower $M_1$, a loop switch $S_1$, and a bypass circuit.

The source follower M1 includes an N-type field-effect transistor or an NPN-type triode, but without any limitation; and as an example, this embodiment is described by using the N-type field-effect transistor.

In this embodiment, a drain of the source follower $M_1$ connects to an input/output end of the sampling and holding circuit 2, a source of the source follower connects to an input end $V_{in}$ of the I-V transforming circuit 1 and an output end of the current output sensor 3, a gate of the source follower connects to an output end $V_{out}$ of the I-V transforming circuit 1 via the loop switch $S_1$, and the gate of the source follower also connects to the bypass circuit.

The loop switch $S_1$ is an electronic switch or a physical switch. For example, the electronic switch may be a field-effect transistor or a bipolar junction transistor. This embodiment has no limitation on the type of the loop switch $S_1$.

In this embodiment, the current output sensor 3 includes a parasitic capacitor $C_3$. One end of the parasitic capacitor $C_3$ connects to a ground terminal GND1, and the other end of the parasitic capacitor $C_3$ connects to an output end of the current output sensor 3. The output end of the current output sensor 3 connects to the source of the source follower $M_1$ and the input end $V_{in}$ of the I-V transforming circuit 1. A current $I_0$ is output by the output end of the current output sensor 3. A direct current component output by the current output sensor 3 is I.

In this embodiment, the sampling and holding circuit 2 includes: a sampling field-effect transistor $M_2$, a sampling capacitor $C_2$, and a sampling switch $S_2$. One end of the sampling capacitor $C_2$ and a source of the sampling field-effect transistor M2 are connected to a power supply voltage VDD. The other end of the sampling capacitor $C_2$ connects to a gate of the sampling field-effect transistor $M_2$ and one end of the sampling switch $S_2$. The other end of the sampling switch $S_2$ and a drain of the sampling field-effect transistor $M_2$ are connected to the drain of the source follower $M_1$.

In the sampling and holding circuit 2, when the sampling switch $S_2$ is closed, the sampling field-effect transistor $M_2$ is equivalent to a resistor having a resistance of gm. Because the source follower $M_1$ usually works in a sub-threshold region, the resistance of the sampling field-effect transistor $M_2$ is in positive proportion to the direct current component I output by the current output sensor 3, i.e. gm=α·I (α is a constant).

In this embodiment, the I-V transforming circuit 1 includes an inverting amplifier and at least one transforming path. The transforming path connects between an input end and an output end of the inverting amplifier. The input end and the output end of the inverting amplifier respectively form the input end $V_{in}$ and the output end $V_{out}$ of the I-V transforming circuit 1.

The inverting amplifier includes an inverter or an operational amplifier (but without any limitation). The transforming path includes a resistor and a switch which are connected in series, or a capacitor and a switch which are connected in series. Moreover, there may be multiple or a single transforming path. The type of serial connection of the transforming path and the number of the transforming paths may be specifically set according to actual situations in this embodiment, and this is not limited in this embodiment.

This embodiment provides two examples of the I-V transforming circuit 1, and specific descriptions are as follows.

Figure 3:
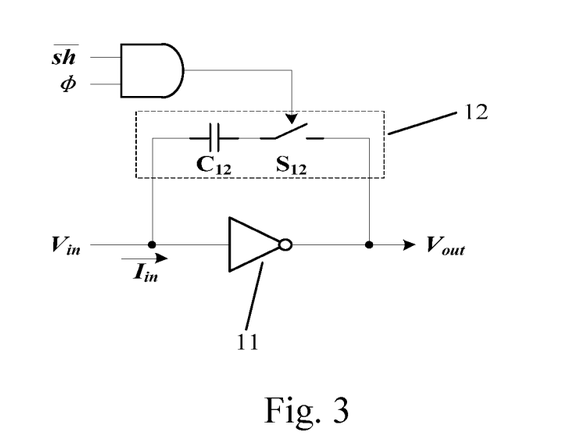
FIG. 3 is a circuit structural diagram of an I-V transforming circuit of a first example according to the first embodiment.

In an I-V transforming circuit of the first type, as shown in FIG. 3, the inverting amplifier is an inverter 11, and a transforming path 12 includes a capacitor $C_{12}$ and a converting switch $S_{12}$ which are connected in series. Specifically, one end of the capacitor $C_{12}$ connects to an input end $V_{in}$ of the inverter 11, and the other end of the capacitor $C_{12}$ connects to one end of the converting switch $S_{12}$. The other end of the converting switch $S_{12}$ connects to an output end $V_{out}$ of the inverter 11. The input end $V_{in}$ and the output end $V_{out}$ of the inverter 11 respectively form the input end Vin and the output end $V_{out}$ of the I-V transforming circuit 1.

In the I-V transforming circuit of the first type, when the converting switch $S_{12}$ is disconnected, the transforming path 12 does not work. In this situation, the I-V transforming circuit 1 is equivalent to an open-loop amplifier. When the converting switch $S_{12}$ is closed, the I-V transforming circuit 1 converts an input current signal $I_{in}$ into a voltage signal and outputs the voltage signal. The converting switch $S_{12}$ is controlled by a clock signal φ to disconnect and close at intervals. The input current signal $I_{in}$ is an alternating current component output by the current output sensor 3.

Figure 4:
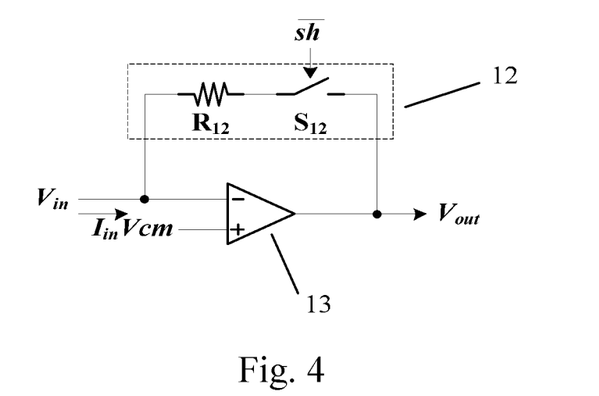
FIG. 4 is a circuit structural diagram of an I-V transforming circuit of a second example according to the first embodiment.

In an I-V transforming circuit of the second type, as shown in FIG. 4, the inverting amplifier is an operational amplifier 13, and the transforming path 12 includes a resistor $R_{12}$ and a converting switch $S_{12}$ which are connected in series. Specifically, one end of the resistor $R_{12}$ connects to an input end Vin of the operational amplifier 13, that is, an inverting input end of the operational amplifier 13. An in-phase input end of the operational amplifier 13 receives a common-mode power supply $V_{cm}$. The other end of the resistor R12 connects to an end of the converting switch $S_{12}$. The other end of the converting switch S12 connects to an output end $V_{out}$ of the operational amplifier 13. The input end $V_{in}$ and the output end $V_{out}$ of the operational amplifier 13 respectively form the input end $V_{in}$ and the output end $V_{out}$ of the I-V transforming circuit 1.

In the I-V transforming circuit 1 of the second type, when the converting switch $S_{12}$ is disconnected, the transforming path 12 does not work. In this situation, the I-V transforming circuit 1 is equivalent to an open-loop amplifier. When the converting switch $S_{12}$ is closed, the I-V transforming circuit 1 converts an input current signal $I_{in}$ into a voltage signal and outputs the voltage signal.

In practice, there are various other implementing manners of the I-V transforming circuit 1 which are not limited in this embodiment. Any implementing manner of the I-V transforming circuit 1 that can make the I-V converting module work normally may be applied to this embodiment. For example, the I-V transforming circuit 1 may be connected by an operational amplifier and a transforming path including a capacitor and a switch which are connected in series, or may be connected by an inverter and a transforming path including a resistance and a switch which are connected in series.

In this embodiment, the bypass circuit may include a bypass switch $S_3$ and a power supply. The bypass switch $S_3$ connects between a gate of the source follower M1 and the power supply. The power supply of the bypass circuit may be the power supply voltage VDD of the sampling and holding circuit 2, or may be an individual power supply. This is not limited in this embodiment.

In the bypass circuit, the bypass circuit is disabled when the bypass switch $S_3$ is disconnected, that is, the bypass circuit is in a non-working state. The bypass circuit is enabled when the bypass switch $S_3$ is closed, that is, the bypass circuit is in a working state. In this case, the gate of the source follower $M_1$ connects to the power supply, the source follower $M_1$ enters into a linear region, and the source follower $M_1$ is equivalent to a closed switch.

In this embodiment, when a control signal sh is at a high level, the loop switch $S_1$ is closed and the bypass circuit is disabled, that is, the bypass switch $S_3$ is disconnected. A feedback loop, formed by the source follower $M_1$, the I-V transforming circuit 1, and the loop switch $S_1$, is conducted, and the I-V converting module enters into a sampling setup stage. The loop switch $S_1$ is disconnected and the bypass circuit is enabled, that is, the bypass switch $S_3$ is closed, the feedback loop is bypassed, and the I-V converting module enters into an I-V converting stage.

For example, in the I-V converting module, as shown in FIG. 2 and FIG. 3, in this embodiment, the loop switch $S_1$ and the sampling switch $S_2$ are controlled by the control signal sh, and the converting switch $S_{12}$ is controlled by a control signal $\overline{sh}$. When the control signal sh is at a high level, the loop switch $S_1$ and the sampling switch $S_2$ are closed, and the converting switch $S_{12}$ and the bypass switch $S_3$ are disconnected. The feedback loop is conducted, the source follower $M_1$ enters into a saturation region and separates the sampling and holding circuit 2 from the current output sensor 3. The I-V converting module enters into a sampling setup stage, that is, the sampling and holding circuit 2 begins to sample a current, the gate and the drain of the sampling field-effect transistor $M_2$ are short-circuited, and charges the sampling capacitor $C_2$, and finally a voltage $V_{c2}$ in one end of the sampling capacitor $C_2$ stabilizes to a voltage value, making a drain current of the sampling field-effect transistor $M_2$ be equal to the direct current component I output by the current output sensor 3. In this case, the sampling field-effect transistor $M_2$ is equivalent to a resistor having a resistance of gm, and the resistor, the sampling capacitor $C_2$, and a capacitor seen from the drain of the source follower $M_1$ are connected in parallel to generate a time constant τ1. When the control signal sh is at a low level, the loop switch $S_1$ and the sampling switch $S_2$ are disconnected, and the converting switch S12 and the bypass switch $S_3$ is closed. The I-V converting module enters into an I-V converting stage, the sampling field-effect transistor $M_2$ outputs a constant current and counteracts the direct current component I. At the same time, the source follower $M_1$ enters into the linear region. In this situation, the source follower $M_1$ is equivalent to a closed switch, the I-V transforming circuit converts an alternating-current signal output by the current output sensor 3 into a voltage output signal.

Specifically, in the existing technology, in the sampling setup stage, that is, when the control signal sh is at a high level, the switch $S_2$ is closed, and a voltage of a plate of the parasitic capacitor $C_3$ connected to the sampling capacitor $C_2$ begins to be established. In this situation, the sampling field-effect transistor $M_2$ is equivalent to a resistor having a resistance of gm. Because the sampling field-effect transistor $M_2$ usually works in a sub-threshold region, the resistance of the sampling field-effect transistor $M_2$ is in positive proportion to the direct current component I output by the current output sensor 3, that is, gm=α·I, where α is a constant, and a time constant of the sampling and holding circuit 2 is τ=$(C_3+C_2)$/gm=$(C_3+C_2)$/α·I.

In this embodiment, because the source follower $M_1$ is in the saturation region, the channel thereof is pinched off, it is hard to see a capacitor from the drain of the source follower $M_1$. Therefore, the time constant τ1=$C_2$/gm1, where gm1 is a transconductance of the sampling field-effect transistor $M_2$. Compared with the existing time constant τ=$(C_3+C_2)$/gm=$(C_3+C_2)$/α·I, where α is a constant and is a ratio of gm to I, $C_3$ has no impact on the time constant τ1. If $gm_1$=1 μs, $C_3$=100 pF, and $C_2$=1 pF, the time constant of the sampling and holding circuit 2 is τ≈1 μs, that is, compared with an existing sampling and holding circuit, the setup speed of the sampling and holding circuit 2 is almost increased by 100 times (usually is increased by 10 to 100 times). Therefore, the I-V transforming circuit 1 only needs a very short time to convert the alternating current component output by the current output sensor 3.

In detail, in the existing technology, in the I-V transforming circuit 1, a time constant of the input end Vin is τ2=$C_3$·Req, where Req is an equivalent impedance of an input end $V_{in}$ in a loop formed by the transforming path 12 and the inverter 11. Assuming that a gain of the inverter 11 is A, it can be deducted that Req=1/($gm_2$·A), where $gm_2$ is a transconductance of the source follower M1, and the time constant of the input end $V_{in}$ can be changed to τ2=$(C_3+A)$/A.

In this embodiment, in the I-V transforming circuit 1, the time constant of the input end Vin is τ2=$C_3$·Req, where Req is an equivalent impedance of an input end Vin in a loop including the transforming path 12 and the inverter 11. Assuming that a gain of the inverter 11 is A, it can be deducted that Req=1/($gm_2$·A), where $gm_2$ is a transconductance of the source follower M1, and the time constant of the input end Vin can be changed to $\tau2=(C_3+A)/(gm_2 \cdot A)$. Compared with the existing $\tau2=(C_3+A)/A$ technology, the setup speed of the input end $V_{in}$ may be greatly increased by approximately 10 to 100 times.

Compared with the existing technologies, this embodiment provides an I-V converting module, the feedback loop is formed by the source follower M1, the I-V transforming circuit 1, and the loop switch S1, enabling the source follower M1 to be in the saturation region in the sampling setup stage, so as to separate the parasitic capacitor $C_3$ from the sampling capacitor $C_1$, that is, to separate the sampling and holding circuit 2 from the current output sensor 3. A time constant formed by the parasitic capacitor $C_3$ and the sampling capacitor $C_1$ is greatly decreased, thereby greatly accelerating the setup speed of the sampling and holding circuit 2, and increasing the converting rate of the I-V transforming circuit. A control circuit of the I-V converting module provided by the present invention is relatively simple, and the formed feedback loop reuses the inverting amplifier in the I-V transforming circuit, which reduces the circuit costs.

A second embodiment of the present invention relates to an I-V converting module. Improvements are made in the second embodiment based on the first embodiment, and the main improvement is: in the second embodiment of the present invention, as shown in FIG. 5, a loop capacitor $C_1$ is added in the feedback loop.

In this embodiment, the loop capacitor $C_1$ connects between the gate of the source follower $M_1$ and the input end $V_{in}$ of the I-V transforming circuit 1. The loop capacitor $C_1$ is in parallel connection with the inverter 11. Due to the Miller effect, the loop capacitor $C_1$ is doubled to the source of the source follower $M_1$. Therefore, the source of the source follower $M_1$ generates a low-frequency pole to make the feedback loop more stable.

Figure 5:
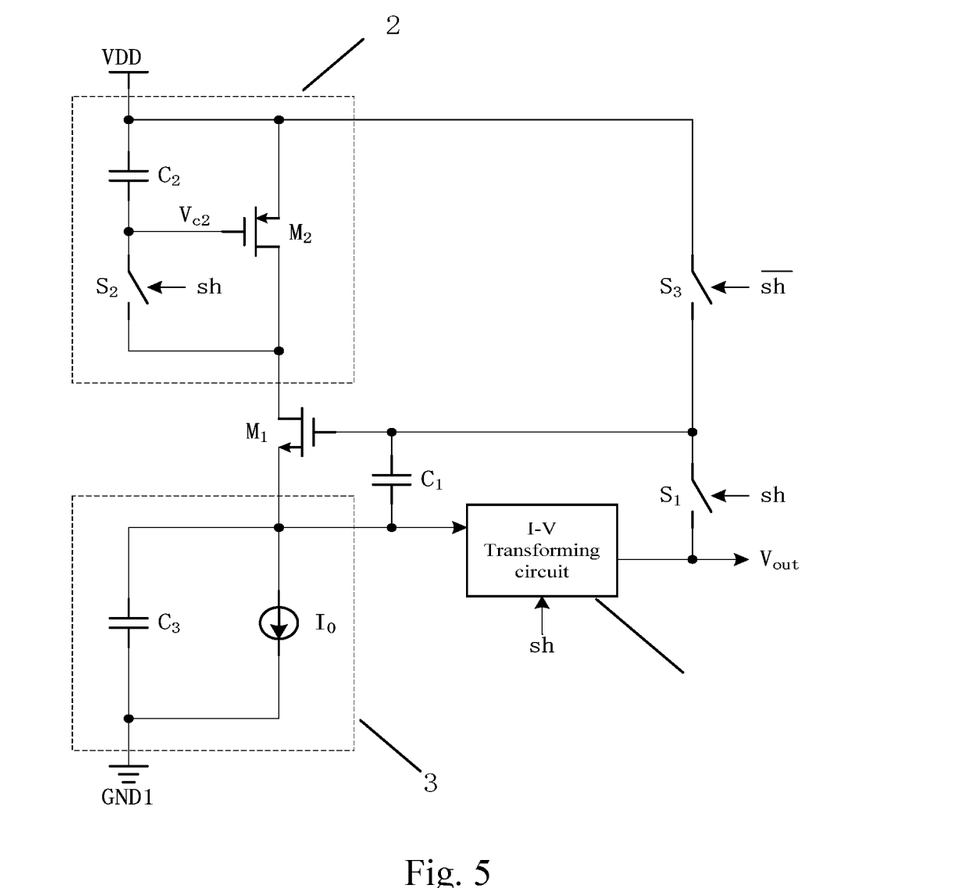
FIG. 5 is a circuit structural diagram of an I-V converting module according to a second embodiment.

For example, in this embodiment, as shown in FIG. 3 and FIG. 5, in the I-V converting module, the time constant of the input end $V_{in}$ of the I-V transforming circuit 1 is $\tau2=C_3 \cdot Req$, where Req is an equivalent impedance of an input end $V_{in}$ in a loop including the transforming path 12 and the inverter 11. Assuming that a gain of the inverter 11 is A, it can be deducted that $Req=1/(gm_2 \cdot A)$, where $gm_2$ is a transconductance of the source follower M1, and the time constant of the input end Vin can be changed to $\tau2=(C_3+C_1 \cdot A)/(gm_2 \cdot A)$. Compared with $\tau2=(C_3+A)/(gm_2 \cdot A)$ in the first embodiment, the setup speed of the input end $V_{in}$ is greatly increased.

Compared with the technology of the first embodiment, this embodiment adds the loop capacitor $C_1$ in the feedback loop, thereby improving the stability of the feedback loop.

Figure 6:
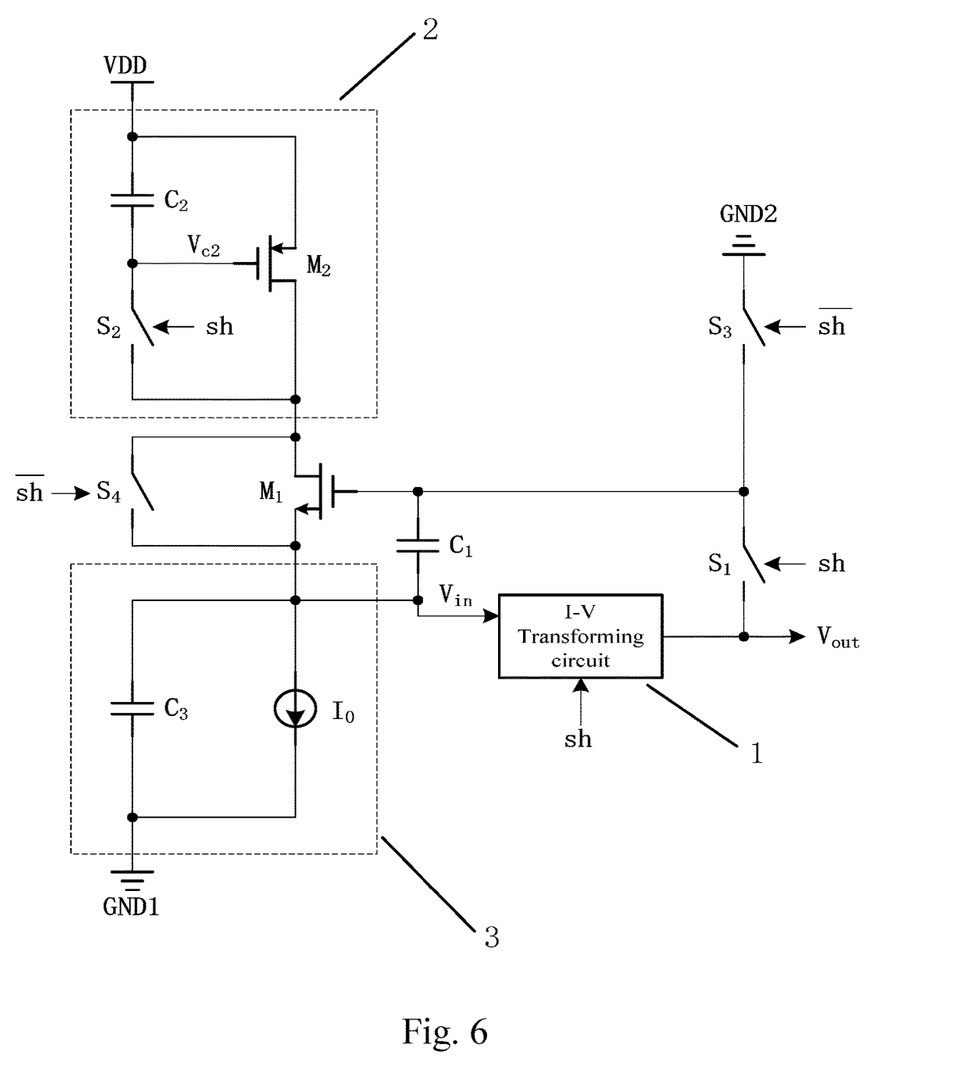
FIG. 6 is a circuit structural diagram of an I-V converting module according to a third embodiment.

A third embodiment of the present invention relates to an I-V converting module. The third embodiment is substantially similar to the second embodiment, and the main difference is: in the second embodiment, the bypass circuit includes the bypass switch and the power supply. However, in the third embodiment of the present invention, as shown in FIG. 6, the bypass circuit includes a first bypass switch $S_3$ (that is, the bypass switch $S_3$ in the second embodiment), a second bypass switch $S_4$, and a ground plane GND2.

In this embodiment, the first bypass switch $S_3$ connects between the gate of the source follower $M_1$ and the ground plane GND2; and the second bypass switch S4 connects between the source and the drain of the source follower $M_1$.

Preferably, the second bypass switch $S_4$ uses a P-type field-effect transistor, but without any limitation on the type of transistor.

In the bypass circuit, when both of the first bypass switch $S_3$ and the second bypass switch $S_4$ are disconnected, the bypass circuit is disabled, that is, the bypass circuit is in a non-working state. When both of the first bypass switch $S_3$ and the second bypass switch $S_4$ are closed, the bypass circuit is enabled, that is, the bypass circuit is in a working state.

In this embodiment, when a control signal sh is at a high level, a loop switch S1 is closed, and the first bypass switch $S_3$ and the second bypass switch S4 are disconnected. When the feedback loop is beginning to work, the source follower M1 enters into the saturation region (due to a negative feedback). When sh is at a low level, the loop switch $S_1$ is disconnected, and both of the first bypass switch $S_3$ and the second bypass switch $S_4$ are closed, and the feedback loop is bypassed. In this case, the I-V transforming circuit is equivalent to a regular transforming circuit, the gate of the source follower $M_1$ connects to the ground plane GND2, and the source follower M1 enters into a cutoff region. At the same time, the second bypass switch $S_4$ is closed, and the source follower $M_1$ is short-circuited.

Compared with the second embodiment, the mechanism of the bypass circuit in this embodiment is different. In the sampling setup stage of the second embodiment, the gate of the source follower $M_1$ is pulled to a terminal of the power supply. There is usually a relatively big voltage ripple at the terminal of the power supply, and there is a parasitic capacitor between the gate of the source follower $M_1$ and the source as well as the drain of the source follower $M_1$. Therefore, the bypass circuit may introduce the ripple of the voltage to the I-V transforming circuit 1, that is, a large amount of noise may be introduced, resulting in impact on a final signal-to-noise ratio. In this embodiment, in the sampling setup stage, the gate of the second bypass switch $S_4$ (when being a P-type field-effect transistor) is grounded and is conducted the short-circuited source follower $M_1$, and the gate of the source follower $M_1$ connects the ground plane GND2 (that is, is grounded), avoiding introducing the ripple of the power supply to the I-V transforming circuit, so as to increase the signal-to-noise ratio of the I-V transforming circuit 1, that is, to improve the power supply rejection capability of the I-V transforming circuit.

Compared with this embodiment, in the second embodiment, when the source follower is in the linear region in the sampling setup stage, the source follower is equivalent to a closed switch, such that some switches in the circuit are reduced, and the costs as well, and the control complexity of the I-V converting module is decreased.

It should be noted that, modules involved in this embodiment are all logical modules. During actual application, a logical unit may be a physical unit, or may be part of a physical unit, or may be implemented as a combination of multiple physical units. In addition, to highlight the innovative part of the present invention, units without very close relationship with the solving of the technical problems in the present invention are not introduced in this embodiment, which does not indicate that other units are not included in this embodiment.

A person of ordinary skill in the art can understand that the above embodiments are specific embodiments to implement the present invention, but during actual application, various changes can be made to the forms and details without departing from the spirit and scope of the present invention.

What is claimed is:

1. An I-V (current to voltage) converting module, comprising: a current output sensor, an I-V transforming circuit, a sampling and holding circuit, a source follower, a loop switch, and a bypass circuit;
   wherein a drain of the source follower is connected to an input/output end of the sampling and holding circuit, a source of the source follower is connected to an input end of the I-V transforming circuit and an output end of the current output sensor, and a gate of the source follower is connected to an output end of the I-V transforming circuit via the loop switch; and
   wherein the gate of the source follower is further connected to the bypass circuit;
   wherein when the loop switch is closed and the bypass circuit is disabled, a feedback loop formed by the source follower, the I-V transforming circuit and the loop switch is conducted, and the I-V converting module enters into a sampling setup stage; and
   wherein when the loop switch is disconnected and the bypass circuit is enabled, the feedback loop is bypassed, and the I-V converting module enters into an I-V converting stage.

2. The I-V converting module according to claim 1, wherein the I-V converting module further comprises a loop capacitor; and
   wherein the loop capacitor is connected between the gate of the source follower and the input end of the I-V transforming circuit.

3. The I-V converting module according to claim 1, wherein the bypass circuit comprises a bypass switch and a power supply, and the bypass switch is connected between the gate of the source follower and the power supply; and
   wherein the bypass circuit is disabled when the bypass switch is disconnected.

4. The I-V converting module according to claim 1, wherein the bypass circuit comprises a first bypass switch, a second bypass switch, and a ground plane;
   wherein the first bypass switch is connected between the gate of the source follower and the ground plane;
   wherein the second bypass switch is connected between the source and the drain of the source follower; and
   wherein the bypass circuit is disabled when both of the first bypass switch and the second bypass switch are disconnected.

5. The I-V converting module according to claim 1, wherein the I-V transforming circuit comprises an inverting amplifier and at least one transforming path;
   wherein the transforming path is connected between an input end of the inverting amplifier and an output end of the inverting amplifier; and
   wherein the input end of the inverting amplifier and the output end of the inverting amplifier form the input end and the output end of the I-V transforming circuit, respectively.

6. The I-V converting module according to claim 5, wherein, the inverting amplifier comprises an inverter or an operational amplifier.

7. The I-V converting module according to claim 5, wherein the transforming path comprises a resistor and a switch connected in series, or a capacitor and a switch connected in series.

8. The I-V converting module according to claim 1, wherein the source follower comprises an N-type field-effect transistor or an NPN-type triode.

9. The I-V converting module according to claim 1, wherein the loop switch is an electronic switch or a physical switch.

* * * * *